United States Patent [19]

Lal et al.

[11] Patent Number: 5,127,991
[45] Date of Patent: Jul. 7, 1992

[54] UNIFORMITY OF COPPER ETCHING IN THE FABRICATION OF MULTILAYER PRINTED CIRCUIT BOARDS

[75] Inventors: Sudarshan Lal, Glen Rock; Craig G. Smith, Bridgewater, both of N.J.

[73] Assignee: AT&T Bell Laboratories, Murray Hill, N.J.

[21] Appl. No.: 709,050

[22] Filed: Jun. 3, 1991

[51] Int. Cl.$^5$ ............................ B44C 1/22; C23F 1/00
[52] U.S. Cl. .............................. 156/659.1; 156/640; 156/656; 156/666; 156/345; 156/902; 252/79.4; 252/79.5
[58] Field of Search ...................... 156/656, 659.1, 666, 156/345, 901, 902, 640, 642; 252/79.2, 79.4, 79.5, 142, 156; 134/3

[56] References Cited

PUBLICATIONS

Veniamin G. Levich, Physiochemical Hydrodynamics 1962, Prentice-Hall, Inc., pp. 93–102.
John S. Newman, Electrochemical Systems 1973, Prentice-Hall, Inc., pp. 307–310.
R. E. Markle, Processing and Economic Aspects of Etchant Regeneration, Plating and Surface Finishing, Jan. 1983, pp. 58"62.
V. V. Isaev et al., Zasch. Met., vol. 13, No. 4, Jul. 1977, pp.. 444–445.
A. F. Bogenschuetz et al., Chemical Abstracts, vol. 90, No. 161138z, 1979.
A. Tanaka, Chemical Abstracts, vol. 105, No. 105-1069-57u, 1986.

*Primary Examiner*—William A. Powell
*Attorney, Agent, or Firm*—Oleg E. Alber

[57] ABSTRACT

This invention is a process for etching copper sheets on insulating boards for use in fabricating multilayer printed circuit boards. The improvement resides in adding to a standard copper etching solution certain alkyltrimethyl ammonium chlorides with alkyl chain lengths ranging from 6 to 20 carbon atoms in amounts sufficient to yield intermediate kinetics behavior. Of special interest are dodecyltrimethyl ammonium chloride, hexadecyltrimethyl ammonium chloride and octadecyltrimethyl ammonium chloride present in an amount of from 0.01 to 1.0 wt %. A silicon-based antiforming agent may be added in amounts of from 0.05 to 2.0 wt. % to prevent an unacceptably large amount of foam from occurring during etching. With this formulation, the rate is mass transport controlled at low rates and almost independent of mass transport at high rates due to the inhibition of the surface reaction rate. As a result, non-uniformities in etch rates due to variations in mass transport conditions in processing equipment may be eliminated. This unique formulation could significantly improve the yields presently obtained in manufacturing as well as allow the processing of fineline multilayer circuit boards.

12 Claims, 5 Drawing Sheets

UNIFORMITY OF COPPER ETCHING IN THE FABRICATION OF MULTILAYER PRINTED CIRCUIT BOARDS

FIELD OF THE INVENTION

This invention is concerned with improved uniformity of patterns etched in copper sheets in the process of fabricating multilayer printed circuit boards.

BACKGROUND OF THE INVENTION

Copper etching is a crucial step in the processing of multilayer printed circuit boards (MLPCB). Copper sheets, laminated to glass fiber reinforced epoxy board substrates and destined to become inner layer circuitry, are imaged and then etched typically using acid $CuCl_2$-based etchant solutions to produce the inner layer circuitry on the substrate. Two or more individual substrates are then bonded with inner layer circuitry being inside of the MLPCB. An example of an intermediate stage of a MLPCB, denoted as 1, is shown in FIG. 1. The intermediate stage comprises boards, 2, of a C stage glass fiber reinforced material, metal conductors, 3, and bonding layers, 4, which may be of a prepreg or B stage material. The intermediate stage may also include metallizations, 5, on the outer surfaces of the boards, which eventually shall be patterned into the outer circuitry of the MLPCB. Typically, alkaline copper etchants are being used for this etching.

The acid cupric chloride etchant is used to produce about 80% of inner layer boards, 85% of the print-and-etch boards, and 90% of the flexible circuit boards manufactured in the United States. The presently used etchant and associated equipment are adequate for relatively simple circuits. However, significant non-uniformities in the etch rate across the boards are observed, with variations in the etch rate across the board ranging typically from 5 to 10% and in some instances up to 30%. This suggests that the processing of these boards requires more stringent control of the copper etching process. In addition, the multilayer boards developed for computer applications are more complex and use smaller conducting lines. Improving the etch uniformity should improve the fine line etching capability.

Numerous attempts were made to improve the uniformity of the copper etching process with $CuCl_2$ etchant. For example, Isaev and coworkers indicate that addition of metal chlorides increases the etching rate. See V. V. Isaev et al., Zasch. Met., Vol. 13, No. 4, July 1977, pp. 444-445. Improvement in the etching of metals using solutions containing both ferric and cupric chloride by varying the pH, temperature, and salt concentration has also been reported by A. F. Bogenschuetz et al., Chemical Abstracts, Vol. 90, No. 161138z, 1979. It has also been reported that undercutting effects may be reduced by the addition of a mixture of an anionic surfactant with a structure $RO(CH_2CH_2=O)_n$-$SO_3R'$ and a nonionic surfactant of N-alkanolmonocarboxamide, where R' represents either H or an alkali metal and R is a ($C_{6-15}$) alkyl group. See A. Tanaka, Chemical Abstracts, Vol. 105, No. 105-106957u, 1986.

However, while some progress was made in improving the etch rate, the need for more stringent control of the etching process and more uniform etching of copper is still present.

SUMMARY OF THE INVENTION

This invention is a process for etching copper sheets on insulating boards for use in fabricating multilayer printed circuit boards. The improvement resides in adding to a typical copper etching solution certain alkyltrimethyl ammonium chlorides with alkyl chain lengths ranging from 6 to 20 carbon atoms in amounts sufficient to yield intermediate kinetics behavior. Of special interest are dodecyltrimethyl ammonium chloride, hexadecyltrimethyl ammonium chloride and octadecyltrimethyl ammonium chloride present in an amount of from 0.01 to 1 wt %. A silicon-based antifoaming agent may be added in amounts of from 0.05 to 2.0 wt. % to prevent an unacceptably large amount of foam occurring during etching. With this formulation, the rate is mass transport controlled at low rates and almost independent of mass transport at high rates due to the inhibition of the surface reaction rate. As a result, non-uniformities in etch rates due to variations in mass transport conditions in processing equipment may be eliminated. This unique formulation could significantly improve the yields presently obtained in manufacturing as well as allow the processing of fine-line multilayer as well a dual-sided circuit boards.

DETAILED DESCRIPTION

This invention is a process and chemistry for improving the uniformity of etching process and, thus, of etched circuitry on copper-clad fiberglass reinforced substrates in the process of fabricating printed circuit boards. Applicants have realized that the non-uniformity of the etching process may be attributed to certain characteristics of the processing equipment. In operation, boards with copper sheets thereon pass horizontally between two nozzle matrices which spray the etchant onto the boards. On the top surface of the board, the solution puddles in the middle of the board, while on the edges and the bottom surface of the board, the solution is continuously swept off by the spray.

Therefore, the etch rate is smaller in the middle of the top surface of the board. These observations imply that mass transport, the process by which reactants reach the surface and products are removed from the surface by convective diffusion, plays a significant role in the reaction kinetics and that the uniformity of the etching process may be improved.

Figure 2:
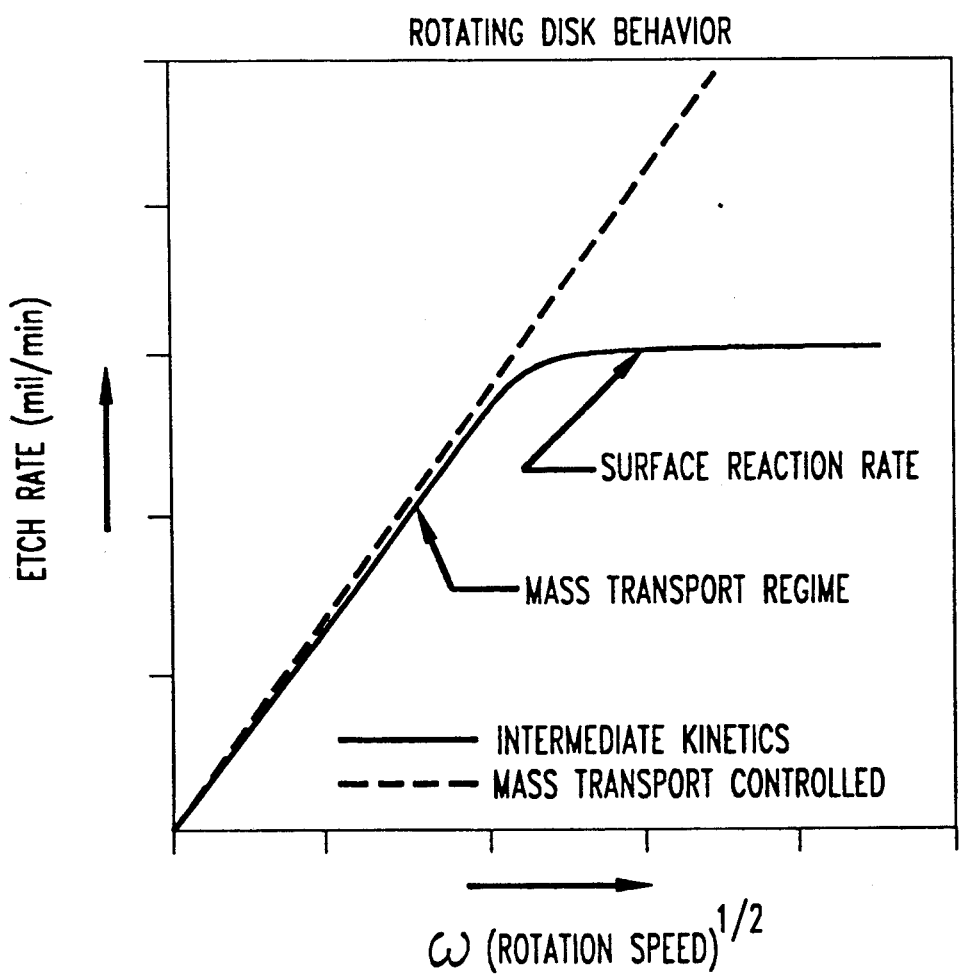
FIG. 2 is a representation of a variation of an etching rate with square root of disk rotation speed for mass transport controlled kinetics as well as for intermediate kinetics.

Theoretical analysis of mass transport conditions at the surface of a rotating disk indicates that the rate of transport of solution species is linearly proportional to the square root of the rotation speed, $\omega$. See Veniamin G. Levich, Physiochemical Hydrodynamics 1962, Prentice-Hall, Inc., pp. 93-102. This characteristic of the rotating disk has been verified by numerous workers in the field. For example, see John S. Newman, Electrochemical Systems 1973, Prentice-Hall, Inc., pp. 307-310. For the case of intermediate kinetics, at low rotation speeds, the rate of solution transport varies as $\omega^{\frac{1}{2}}$, see V. G. Levich, supra., but eventually the surface reaction limits the observed reaction rate and the reaction rate becomes independent of the rotation speed. This generalized behavior is illustrated in FIG. 2. Applicants have concluded, regarding a standard or conventional cupric chloride etchant, that: 1) the etch rate is mass transport controlled over the range of conditions used, 2) the etch rate increases significantly with $Cl^-$ concentration, 3) the etch rate is not limited by $Cu^{+2}$ for concentrated solutions ($>87.5$ g/l copper), 4) the etch rate decreases with $Cu^+$ concentration, but to a smaller extent than the increase due to chloride ion, and 5) cations used in combination with $Cl^-$ affect the rate, with the rate increasing in the order of $NH_4^+ > K^+ > Na^+ > H^+$.

Figure 1:
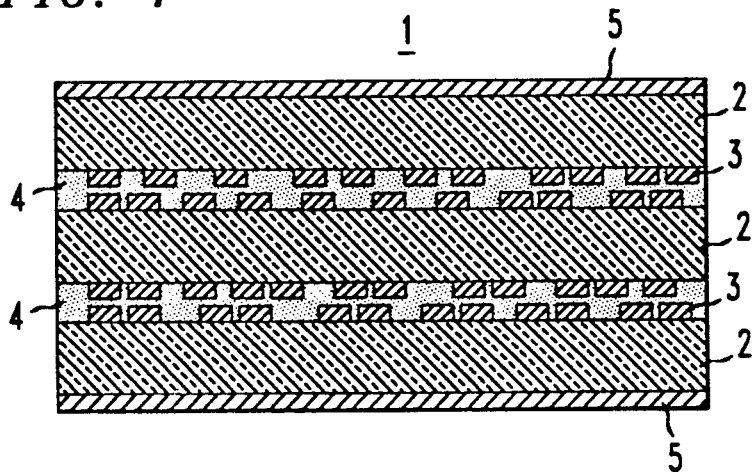
FIG. 1 is a schematic representation of an intermediate stage in MLPCB production, with inner metallization being inward of the MLPCB.

In view of this, the applicants have realized that the uniformity of etching across the board cannot be improved by varying the concentrations of the standard etchant. Since the etch rate for the standard $CuCl_2$ etchant is limited by mass transport under all of the conditions indicated, improvements in the uniformity of the mass transport conditions for the processing equipment could lead to the improvements in the etching uniformity; however, there are limits to improvements in the processing equipment including the reluctance on the part of the user to modify an existing etching line. Therefore, if modifications to the chemistry of the $CuCl_2$ etchant would yield the intermediate kinetics condition indicated in FIG. 1, the cupric chloride etching process would be less sensitive to the characteristics of the processing equipment.

Figure 3:
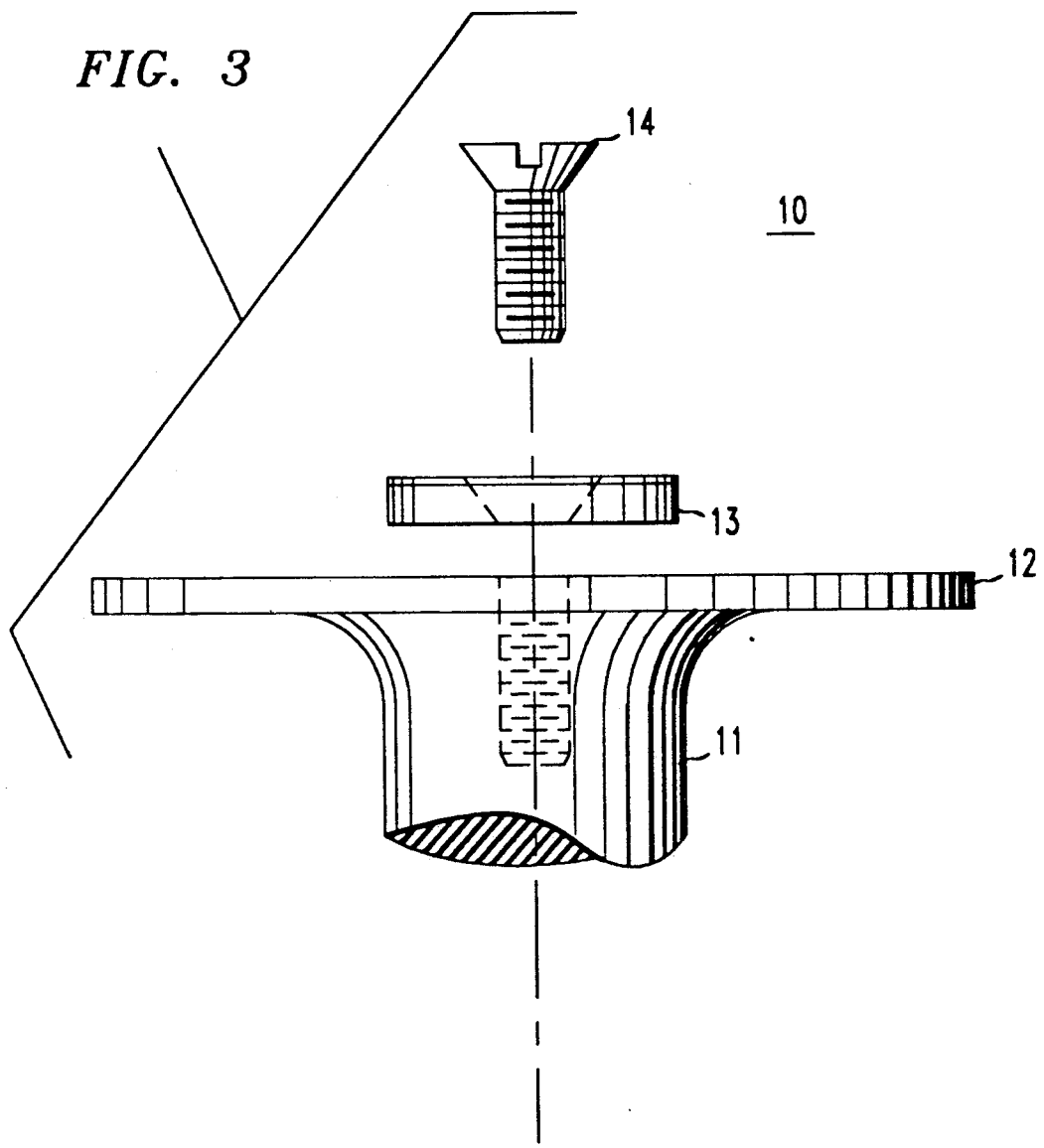
FIG. 3 is a schematic representation of a design of a rotating disk assembly for use in testing mass transport characteristics of the etchant solutions.

Etch rate experiments were performed using 2 oz. (2.8 mils thick) copper clad glass-fiber reinforced epoxy board substrates which corresponded to the material used in the manufacture. To facilitate the use of controlled mass transport conditions for a study of the standard cupric chloride etchant, using this material, a rotating disk assembly, 10, shown in FIG. 3 was used in the tests. The assembly includes a rotator shaft, 11, with an enlarged end surface, 12, on which is positioned a copper clad disk, 13, secured to the rotator shaft by an etch-resistant screw, 14. The copper clad disk of 1.2 cm diameter has a 0.6 cm (0.24 in.) hole in the center to mount the disk to the rotator shaft. The disk was clad with 2 oz (2.8 mils thick) copper layer on 60 mil thick glass-fiber reinforced epoxy board substrate. The rotation speed was varied within a range of from 100 to 2000 rpm using a Pine Instruments Analytical Rotator Model ASR2. A 250 ml volume of the etchant was prepared for each run and experiments were performed on freshly cleaned copper disks in a thermostat controlled cell. The copper surface was cleaned, prior to the etching, using an alkaline cleaner of the following composition: sodium hydroxide (5 oz/gal), sodium carbonate (10 oz/gal), trisodium phosphate (8 oz/gal), dodecyl benzene sulfonate (0.1 oz/gal), and the cleaner bath temperature was maintained at 60° C. The copper disks were soaked in the cleaner for 1 minute, rinsed in warm tap water for 30 seconds, rinsed twice with deionized water, dipped in 10% sulfuric acid for 1 minute, rinsed in deionized water, dried with methanol-air, and weighed on an analytical balance to determine the starting weight of the disk. The disks were then mounted on the rotator shaft, and etched for varying intervals of time. The etched disks were removed from the shaft, washed, dried, and weighed. The etch rate was subsequently calculated using the weight loss.

Typical operating parameters for the standard cupric chloride etchant in use on copper etching processing lines are: 1). 150 to 203 g/l (20-27 oz/gal) total copper, 2). 1.6 to 2.4N HCl, 3). 31° to 35° Be, and 4). 115°-130° F. (46°-55.4° C.). Regeneration of the etchant involves bubbling chlorine gas to maintain an oxidation-reduction potential (ORP) value of 520 mV on Pt vs Ag/AgCl. The specific gravity is maintained by a bleed and feed procedure, adding a 2.0N HCl solution to replace the removed etchant.

Etching experiments were conducted under conditions including 87.5 g/l Cu as cupric chloride, temperature of the etchant of 55° C., and 3 or 4N HCl. Several etchant properties were analyzed for each experiment. The normality of $H^+$ was determined by titration with a standard NaOH solution to a pH of 2.3 using a Mettler Autotitrator Model DL25. Titratable chloride ($Cl^-$) was determined by titrating a known sample volume, acidified with dilute nitric acid, with a 0.1N silver nitrate solution to a first derivative end point. The concentration of cuprous ion was determined by first oxidizing $Cu^+$ with excess ferric sulfate. The equivalent ferrous ions formed was titrated with a 0.1N Ce(IV) standard using ferroin as an indicator. The density of the solution (degrees Baume) was measured with a hydrometer and the oxidation-reduction potential (ORP) measured using a reference Pt-Ag/AgCl couple.

Applicants have discovered that addition to the $CuCl_2$ solution of certain alkyltrimethyl ammonium chlorides in amounts of from 0.01 to 1.0 wt. %, with further addition in some instances of silicone-based antifoaming agents in amounts of from 0.05 to 2.0 wt. % led to the improvement of the mass transport. The alkyltrimethyl ammonium chlorides, selected from those having alkyl chain lengths ranging from 6 to 20, preferably from 10 to 18, carbon atoms, yield the desired intermediate kinetics behavior and etch rate which is very uniform across the disk.

Significant foaming occurred with 0.1 wt. % dodecyltrimethyl ammonium chloride (DTAC) at 2000 rpm; however, the use of 0.26 wt. % of Dow Corning 544 (DC-544) antifoaming agent, resolved this problem. Two additional members of the homologous series represented by DTAC were hexadecyltrimethyl ammonium chloride (HTAC) and octadecyltrimethyl ammonium chloride (OTAC). Table I (See Appendix) illustrates the etch rate at 2000 rpm for the modified etch containing DTAC, HTAC, and OTAC. Potential solubility problems may exist for the use of OTAC. The reduction of the surface reaction rate increases with chain length; therefore, such monovalent alkaline metal chlorides as KCl and NaCl may be added to the etchant to yield a higher etch rate.

Figure 4:
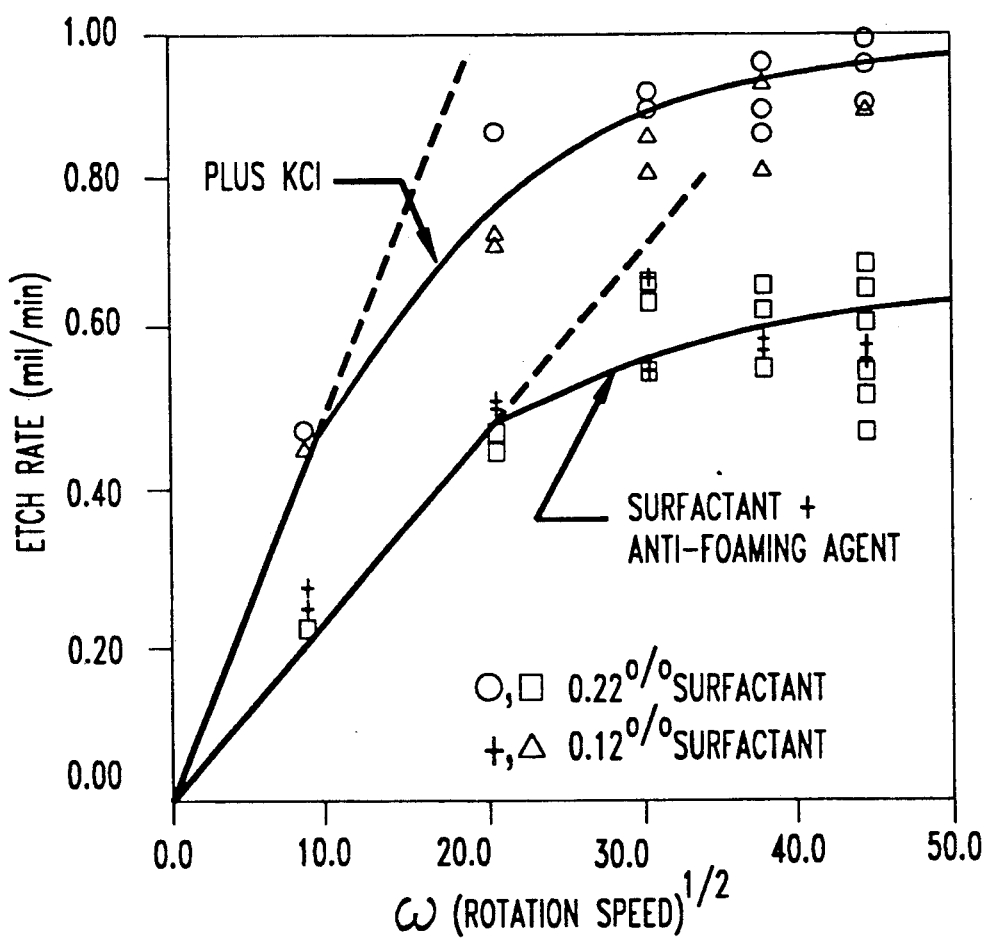
FIG. 4 is a diagram of a variation of etch rate with $\omega^{\frac{1}{2}}$ for the modified cupric chloride etch containing 0.12 and 0.22% dodecyltrimethyl ammonium chloride (DTAC) plus 0.26% (by weight) Dow Corning 544 (DC-544) antifoaming agent, 87.5 g/l $Cu^{+2}$ as cupric chloride, 3N HCl, 55° C.; the upper solid curve marked KCl contains additional 1.0M KCl.

The preferred additive for the modified etch chemistry is dodecyltrimethyl ammonium chloride with a nominal concentration of 0.1 wt. %. When used in combination with 0.1 wt. % DC-544 antifoaming agent, intermediate kinetics are obtained in which the etch rate is independent of mass transport conditions at approximately >1500 rpm. The decrease in etch rate (without additives) at 2000 rpm is from 1.2 mil/min to 0.7 mil/min. KCl or NaCl may be added to the etchant to yield a higher etch rate, still exhibiting intermediate kinetics. FIG. 4 represents the etch rate versus $\omega^{\frac{1}{2}}$ with the addition of DTAC and DC-544 (lower solid line) and also of KCl (upper solid line).

Figure 5:
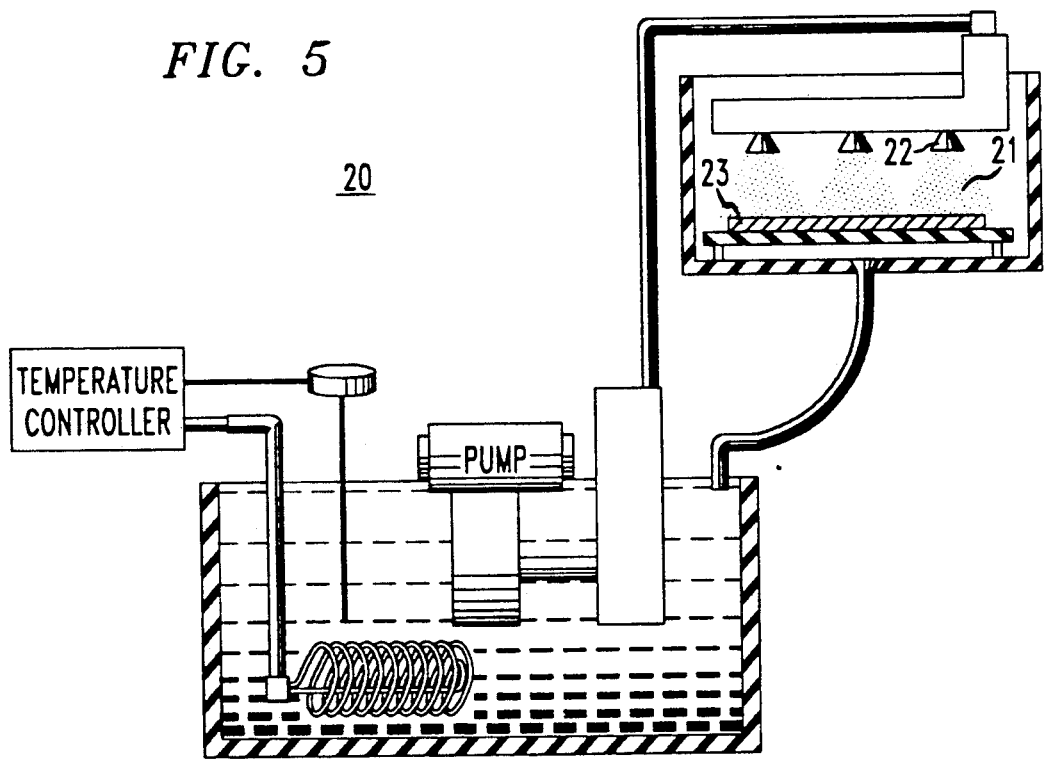
FIG. 5 is a schematic representation of a configuration of spray chamber/reservoir used for stability experiments.

To investigate the stability of these additives, a pilot scale experiment was conducted to age the etchant by etching copper sheets in a spray chamber. The configuration of the apparatus, 20, used for stability tests is shown in FIG. 5, wherein etchant, 21, is being sprayed from nozzles, 22, onto a 2 oz (2.8 mils thick) copper sheet, 23. Regeneration of the etchant was performed using hydrogen peroxide-HCl additions, with a bleed-and-feed operation. A recipe for regeneration of cupric chloride etchants involves the addition of 40 ml of stabilized 35% $H_2O_2$ or 46.7 ml of stabilized 30% $H_2O_2$ and 94.5 ml of 12M HCl for each ounce of copper etched. See R. E. Markle, Processing and Economic Aspects of Etchant Regeneration, Plating and Surface Finishing, January 1983, pp. 59–62, which is incorporated herein by reference.

Two nominal compositions of the modified etchant were investigated for stability. Both compositions contained 90–130 g/l Cu and 2N $H^+$. The first solution was diluted with a diluent containing 0.1 wt. % DTAC and 0.1 wt. % DC-544. The second solution composition contained 1M NaCl at make-up, and was diluted with a solution containing 0.1 wt. % DTAC, 0.1 wt. % DC-544, and 1M NaCl. The etching experiments were conducted at 55° C. Normal operation involved oxidation of cuprous ions after every two hours of etching operation. After four hours of operation, the etchant was diluted to yield a composition of 90 g/l Cu and 2N $H^+$. The normal operation was then repeated for a total of 90 hours, corresponding to about 5 turnovers of the etching bath.

Figure 6:
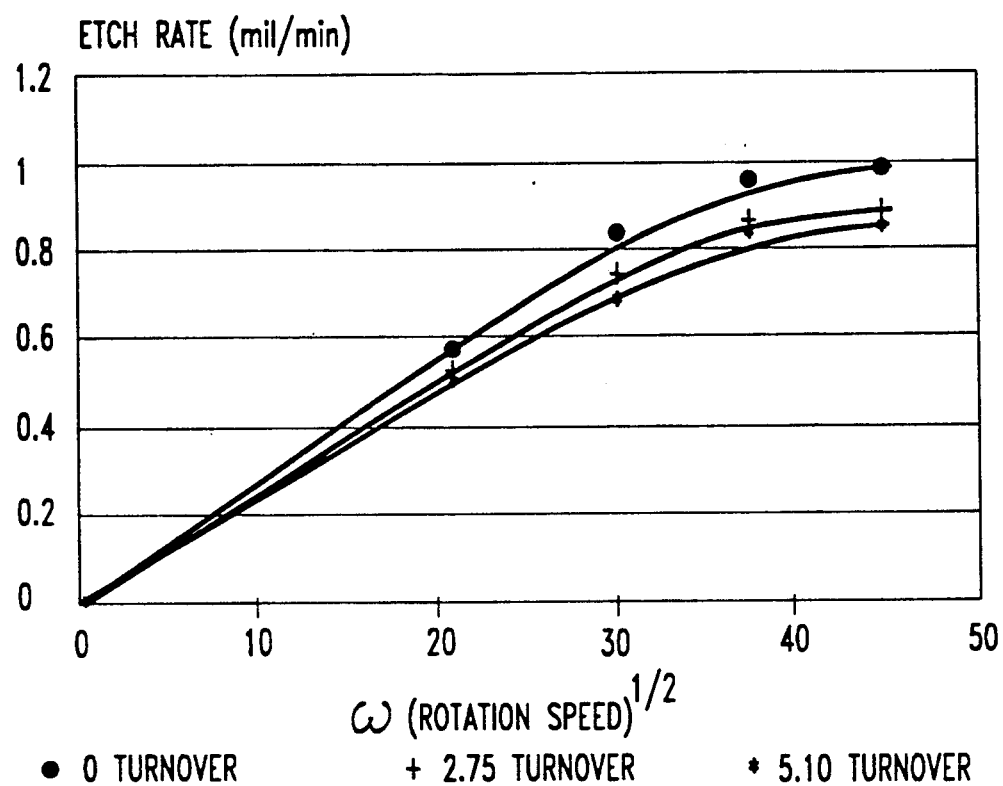
FIG. 6 is a diagram of a stability of cupric chloride etchant containing 2M HCl, 0.1% DTAC and 0.1% DC-544.
Figure 7:
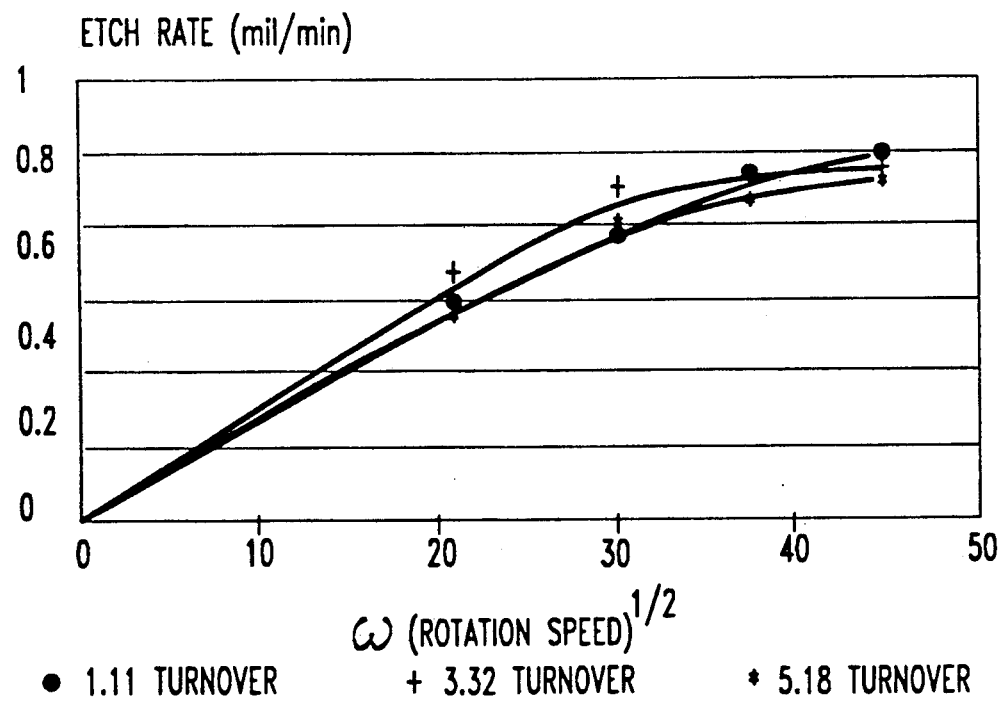
FIG. 7 is a diagram of stability of cupric chloride etchant nominal solution containing 2M HCl, 1M NaCl, 0.1% DTAC and 0.1% DC-544.

The rotating disk behavior shown in FIGS. 6 and 7 indicates that intermediate kinetics were maintained for both solution compositions after 5 turnovers of operation. No degradation of performance has occurred. The high etch rate for the initial solution in FIG. 6 is due to a higher-than normal concentration of $H^+$. The solution properties for both compositions are given in Tables II and III (See Appendix).

For comparison purposes several other modifications to the bath chemistry were investigated: 1): the use of metal chlorides at significant concentrations, and 2): the use of other additives including surfactants at small concentrations. To investigate the effect of metal chlorides on the etch rate, standard conditions of 87.5 g/l $Cu^{+2}$ as cupric chloride, 55° C., and 4N additional $Cl^-$ were used. Rotation speeds of 100 and 2000 rpm were used to test for dependency on mass transport conditions. Cations investigated were $NH_4^+$, $K^+$, $Na^+$, $Li^+$, $Ca^{+2}$, $Mg^{+2}$, $Ba^{+2}$, $Mn^{+2}$, $La^{+3}$ and $Al^{+3}$. Different cations significantly affect the etch rate, but the rate remained mass transport limited. Monovalent cations have the greatest influence on the rate with relative etch rates being $NH_4^+ > K^+ > Na^+ > Li^+$. Divalent cations yield etch rates smaller than those obtained with monovalent cations, including $H^+$. The relative rates are $Ca^{+2} > Mg^{+2} > Ba^{+2} > Mn^{+2}$. For the trivalent cations, $La^{+3}$ yields a larger etch rate than $Al^{+3}$.

To investigate the effect of other additives on the intermediate kinetics and on the etch rate, standard conditions of 87.5 g/l $Cu^{+2}$ as cupric chloride, 55° C., and 3N HCl were used. Rotation speeds of 1500 and 2000 rpm were chosen as being characteristic of the plateau region for intermediate kinetics (FIG. 2). Several organic ammonium chlorides and hydrochlorides were investigated for their effects on the intermediate kinetics. Tetrabutyl ammonium chloride gives intermediate kinetics without the need for an antifoaming agent. However, this additive tends to break down with use as the etch rate for successive experiments increases. The etch is also uneven, giving spotted etching over the millimeter scale. Tetrapentyl ammonium chloride, tetrahexyl ammonium chloride, and tetraoctyl ammonium chloride are all insoluble and as a result do not inhibit the etching reaction. Cetyl pyridinium chloride has a limited solubility and gives a spotty, non-uniform etch. Dodecylamine hydrochloride and octadecylamine hydrochloride are also insoluble.

It is to be understood that the above-described improvements and tests described with reference to acid cupric chloride etchant are applicable to the alkaline copper etchants as well. For example, the uniformity of copper etching with an alkaline etchant having 150 to 203 g/l (20–27 oz/gal) of total copper, 18° to 26.50° Be (1.145–1.225 specific gravity) 5–5.8M HCl, pH=8.2–8.8, useable at a temperature of 115°–130° F. (46°–55° C.), may be improved by the addition of the specified alkyltrimethyl ammonium chlorides and silicone-based antifoaming agents, as needed.

TABLE I

APPENDIX
Useful Additives for the Cupric Chloride Etchant
(87.5 g/l $Cu^{++}$, 55° C., 3 N HCl, 2000 RPM)

| Additive | $H^+$ N | $Cl^-$ N | ORP mV | ρ g/cc | Be° | R mg/s | R mil/min |
|---|---|---|---|---|---|---|---|
|  | 2.66 | 5.35 | 461 | 1.190 | 23.0 | 0.436 | 1.190 |
| 0.057% DB-31 | 2.54 | 5.54 | 483 | 1.190 | 23.4 | 0.405 | 1.105 |
| 0.1% Dodecyltrimethyl ammonium chloride | 2.49 | 5.55 | 519 | 1.190 | 23.4 | 0.265 | 0.723 |
| 0.1% Hexadecyltrimethyl ammonium chloride | 2.44 | 5.53 | 388 | 1.200 | 24.0 | 0.214 | 0.585 |
| 0.1% Octadecyltrimethyl ammonium chloride | 2.50 | 5.66 |  |  |  | 0.135 | 0.368 |

Note: All three trimethyl ammonium chloride solutions also contain 0.1% DC-544 antifoaming agent.
The octadecyltrimethyl ammonium chloride is insoluble at room temp.

TABLE II

Results of Modified Etch Stability Experiment

| Time hours | Turnover | Total Cu g/l | Cu⁺ g/l | Cl⁻ N | H⁺ N | γ dynes/cm | η centipoise | ρ g/cc | Etch Rate mil/min (2000 rpm) | DTAC g/l |
|---|---|---|---|---|---|---|---|---|---|---|
| 0  | 0.0  | 91.3  | 1.6 | 5.85 | 2.72 | 32.4 | 0.942 | 26.0 | 0.97 | 0.94 |
| 52 | 1.16 | 117.2 | 1.6 | 6.55 | 1.80 | 33.8 | 0.954 | 28.6 | 0.80 | 0.34 |
| 60 | 1.96 | 114.2 | 2.4 | 5.69 | 1.81 | 31.9 | 0.954 | 28.4 | 0.77 | 0.49 |
| 70 | 2.75 | 125.9 | 1.6 | 6.70 | 2.04 | 31.2 | 0.989 | 29.6 | 0.87 | 0.51 |
| 74 | 3.40 | 129.6 | 3.2 | 6.33 | 1.95 | 34.0 | 0.973 | 29.1 | 0.86 | 0.36 |
| 90 | 5.10 | 132.1 | 3.0 | 6.83 | 1.85 | 32.0 | 1.020 | 30.8 | 0.84 | 0.50 |

Diluent used-2 N HCl + 0.1% DTAC + 0.1% DC-544

TABLE III

APPENDIX
Results of Modified Etch Stability Experiment

| Time hours | Turnover | Total Cu g/l | Cu⁺ g/l | Cl⁻ N | H⁺ N | γ dynes/cm | η centipoise | ρ g/cc | Etch Rate mil/min (2000 rpm) | DTAC g/l |
|---|---|---|---|---|---|---|---|---|---|---|
| 8  | 1.11 | 111.7 | 7.9 | 7.27 | 1.64 | 34.4 | 1.016 | 30.2 | 0.98 | 0.25 |
| 16 | 2.22 | 130.8 | 0.6 | 7.27 | 1.55 | 32.0 | 1.092 | 32.2 |      | 0.31 |
| 24 | 3.32 | 106.1 | 1.1 | 6.92 | 1.71 | 30.4 | 1.018 | 30.3 | 0.95 | 0.46 |
| 32 | 4.45 | 108.0 | 0.3 | 6.76 | 1.50 | 31.0 | 1.013 | 29.5 |      | 0.54 |
| 38 | 5.18 | 99.9  | 1.4 | 6.71 | 1.78 | 30.5 | 0.989 | 28.6 | 0.93 | 0.61 |

Diluent used-2 N HCl + 1M NaCl + 0.1% DTAC + 0.1% DC-544

We claim:

1. The method of etching patterns in copper sheets on insulating boards for use in fabricating printing circuits boards, which comprises contacting a resist patterned copper sheet on an insulating substrate with an aqueous copper etchant solution for a period sufficient to etch out resist unprotected regions of the copper sheet, in which said etchant solution comprises an alkyltrimethyl ammonium chloride with alkyl chain lengths ranging from 6 to 20, the amount of said chloride in the solution being sufficient to yield an intermediate kinetics behavior.

2. The method of claim 1 in which said alkyltrimethyl ammonium chloride comprises at least one chloride selected from the group consisting of dodecyltrimethyl ammonium chloride, hexadecyltrimethyl ammonium chloride and octadecyltrimethyl ammonium chloride.

3. The process of claim 2 in which said chloride is added in an amount of from 0.01 to 1.0 wt. %.

4. The process of claim 2 in which said alkyltrimethyl ammonium chloride comprises dodecyltrimethyl ammonium chloride.

5. The process of claim 4 in which said dodecyltrimethyl ammonium chloride is added in an amount of from 0.01 to 1.0 wt. %.

6. The process of claim 5 in which said dodecyltrimethyl ammonium chloride is added in an amount of 0.1 wt. %.

7. The process of claim 6 in which said solution contains a silicone-based anti-foaming agent in an amount of 0.1 wt. %.

8. The process of claim 1 in which said copper etching solution contains a silicone based anti-foaming agent.

9. The process of claim 8 in which said anti-foaming agent is present in an amount of from 0.05 to 2.0 wt. %.

10. The process of claim 9 in which said solution contains a silicone-based anti-foaming agent in an amount of 0.1 wt. %.

11. The process of claim 1 in which said copper etching solution is a cupric chloride solution containing 150 to 203 g/l (20–27 oz/gal) of total copper, 1.6 to 2.4N HCl, and being used at a temperature of from 115° to 130° F. (46°–55° C.).

12. The process of claim 1 in which said solution is an alkaline copper etching solution containing 165 to 188 g/l (22–25 oz/gal) of total copper, pH of 8.2 to 8.8, and being used at a temperature within a range of from 115°–130° F. (46°–55° C.).

* * * * *